United States Patent [19]

Imaizumi et al.

[11] Patent Number: 5,113,090
[45] Date of Patent: May 12, 1992

[54] VOLTAGE COMPARATOR

[75] Inventors: Eiki Imaizumi, Akishima; Kunihiko Usui, Asaka; Tatsuji Matsuura, Kokubunji; Toshiro Tsukada, Hachioji; Seiichi Ueda; Hiroshi Sato, both of Takasaki, all of Japan

[73] Assignees: Hitachi Ltd., Chiyoda; Hitachi VLSI Engineering Corporation, Kodaira, both of Japan

[21] Appl. No.: 574,087

[22] Filed: Aug. 29, 1990

[30] Foreign Application Priority Data

Aug. 30, 1989 [JP] Japan ................. 1-221457

[51] Int. Cl.⁵ .............................................. H03K 5/24
[52] U.S. Cl. ...................................... 307/355; 307/353; 307/494
[58] Field of Search ............. 307/353, 355, 356, 491, 307/494

[56] References Cited

U.S. PATENT DOCUMENTS 4,883,987 11/1989 Fattaruso ........................ 307/494
4,899,068 2/1990 Klose et al. ..................... 307/355

*Primary Examiner*—John Zazworsky
*Attorney, Agent, or Firm*—Antonelli, Terry, Stout & Kraus

[57] ABSTRACT

A voltage comparator is provided including a differential amplifier, first, second and third switches, and first and second capacitors. A fourth switch is connected in series between the second and third switches and an input terminal of the differential amplifier. A first input voltage is sampled and held at the first capacitor through the first switch and at the second capacitor through the second and fourth switches, respectively. Thereafter, since the third switch is turned on and the fourth switch is turned off, the first input voltage is sampled and held at the input capacitor of the differential amplifier. Thereafter, the third switch is turned off and the fourth switch turned on. As a result, an on and off operation of the fourth switch is controlled so that a second input voltage which has been sampled at the second capacitor immediately before the switch is turned off is applied to the input capacitor of the differential amplifier.

9 Claims, 7 Drawing Sheets

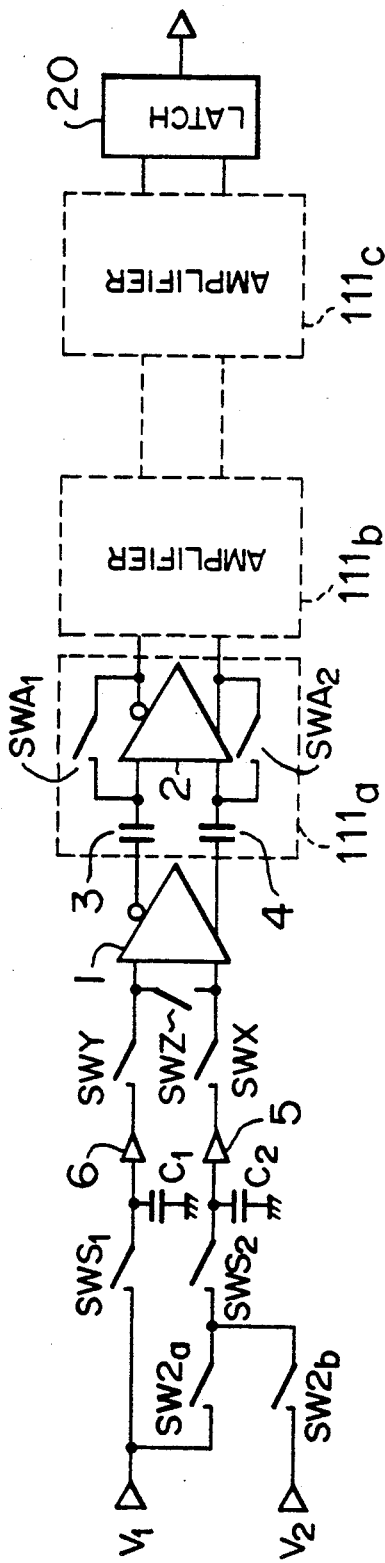
F I G. 8A
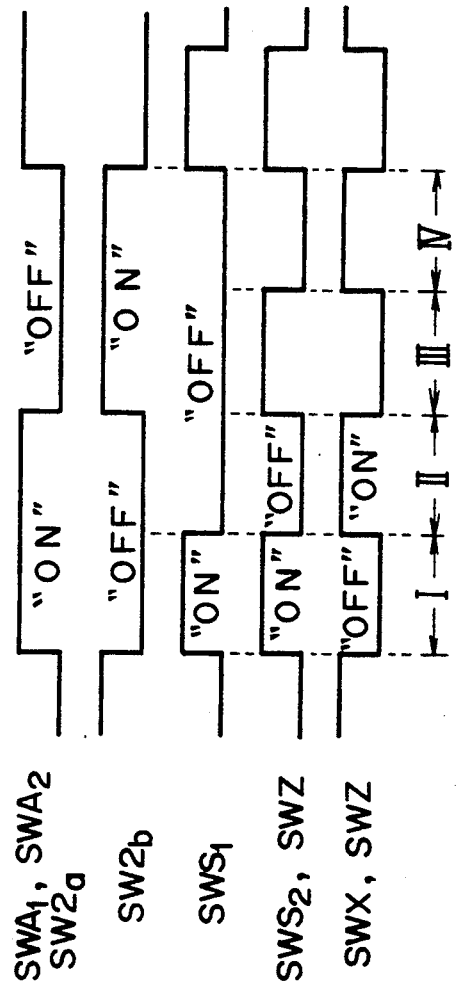
F I G. 8B

VOLTAGE COMPARATOR

BACKGROUND OF THE INVENTION

1. Field of the Invention

The present invention relates to a voltage comparator, and, more particularly, to a voltage comparator which operates at a high speed and is suitable for integration.

2. Description of the Related Art

A voltage comparator related with the present invention has been discussed in IEEE Journal of Solid State Circuits, Vol. SC-17, No. 6, Dec. 1982, pp. 1080–1087.

FIGS. 2A and 2B show a configuration and operating waveforms of a voltage comparator which was considered by the inventors.

The voltage comparator shown in FIG. 2A is constructed of a switch SW1 and a hold capacitor C1 for sampling and holding an input signal V1, switches SW2a and SW2b which provide input signals V1 and V2 to input terminals of a differential amplifier 1, while switching them to each other, a hold capacitor C2 which holds the input signals V1 and V2, differential amplifiers 1 and 2, A.C. coupling capacitors 3 and 4 which couple the differential amplifier 1 and the differential amplifier 2 with each other, switches SWA1 and SWA 2 which make a short-circuit between the input and the output of the differential amplifier 2, and a latch circuit 20 which fetches and defines the output result of the differential amplifier 2.

The voltage comparing operation of the voltage comparator shown in FIG. 2A will be described in detail hereafter with reference to an operating waveform diagram shown in FIG. 2B.

In the voltage comparator, the switches SW1, SW2a, SWA1 and SWA2 turn on, the switch SW2b turns off, the input signal V1 is applied to both input terminals of the differential amplifier 1, and almost equal output voltages are generated at both output terminals of the differential amplifier 1 in the initial period I. Since both the switches SWA1 and SWA2 are turned on, both input voltages of the differential amplifier 2 are set equal to each other at both output voltages, and both input-output voltages of the differential amplifier 2 are self-biased at an equal voltage.

In the next period II, the switches SW1 and SW2a turn off, and the input signal V1 is held equally by hold capacitors C1 and C2 at both input terminals of the differential amplifier 1. At this time, switching charge generated from the switches SW1 and SW2a can be absorbed by the capacitors 3 and 4.

In the next period III, the switches SWA1 and SWA2 turn off, to thereby eliminate short-circuiting between the input and the output of the differential amplifier. Further, the switch SW2b turns on, and an input signal V2 is initiated to be applied (sampled) to the hold capacitor C2 at the input terminal of the differential amplifier 1.

In the next period IV, the switch SW2b turns off, the value of the input signal V2 is suspended to be sampled to the hold capacitor C2 at the input terminal of the differential amplifier 1 and the input signal V2 immediately before the switch SW2b turns off is held by the hold capacitor C2 at the input terminal of the differential amplifier 1. As a result, the input differential voltage which is held by both input terminals of the differential amplifier 1 is amplified by means of the differential amplifier 1, and the magnitudes of the input signals V1 and V2 are judged through the differential amplifiers 1 and 2 and the latch circuit.

SUMMARY OF THE INVENTION

In the above-mentioned related art, the input signal V2 is inputted to the differential amplifier 1 in the period III which is a sampling period of the input signal V2 as shown in FIG. 2A and 2B. Accordingly, the input signal V2 changes between immediately after sampling initiation and sampling termination, and the operation of the differential amplifiers 1 and 2 cannot follow the change of the input voltage V2 in the case where the voltage difference between the voltage immediately after sampling initiation and that at sampling termination is large. Thus, a problem has been discovered by the present inventors that the operation speed of a voltage comparator is reduced when an input signal of high slew rate, that is, the input signal V2 of fast signal change is inputted.

For example, it is assumed that the value of the input signal V2 immediately after sampling initiation is much lower than that of the input signal V1, and V2 is increased with the passage of time to a value close to the input signal V1 at the time of sampling termination. In this case, the input differential voltage between both input terminals of the differential amplifier 1 is high due to the influence by the above-mentioned value which is much lower than the input signal V1 immediately after sampling initiation. Thus, the output differential voltage of the differential amplifier is saturated at a large value. Then, said input differential voltage changes drastically to a value close to zero until the time of sampling termination. In this case, it takes a long time until the output differential voltage of the differential amplifier 1 reaches a defined (asserted) value close to zero because of the response speed limit of the differential amplifier 1. As a result, there is a problem that the operation speed of the voltage comparator slows down when an input signal of high slew rate as described above, that is, an input signal in which signal change is fast, is inputted.

It is a object of the present invention to provide a voltage comparator in which the operation speed is not reduced even if an input signal of high slew rate is inputted.

In order to achieve the object of the present invention by solving the above-mentioned problem, a buffer circuit 5 and a switch SWX are provided in series connection between the switches SW2a and SW2b and an input terminal of the differential amplifier 1 in a typical aspect of the present invention.

First, the input voltage V1 which is a reference for comparison is sampled and held at an input capacitor C1 coupled to one input terminal of the differential amplifier 1 through the switch SW1, and is also sampled and held at another input capacitor C2 coupled to another input terminal of the differential amplifier 1 through the switch SW2a, the buffer circuit 5 and the switch SWX.

Thereafter, when the input signal V2 in the process of change is sampled at the hold capacitor C2 with the switch SW2b on, the connected switch SWX is kept off, and the already sampled stable input voltage V1 is held at a parasitic capacitor of the other input terminal of the differential amplifier.

Thereafter, when the final input signal V2 is held at the hold capacitor C2 with the switch SW2b being turned off, the switch SWX is turned on. As a result, an on and off operation of the switch SWX is controlled so that the input voltage V2 sampled at the hold capacitor C2 immediately before the switch SW2b is turned off is applied to the other input capacitor of the differential amplifier 1 (see e.g. FIGS. 1A and 1B).

Accordingly, the input signal V2 being varied will never be applied to the input terminal of the differential amplifier 1 during the on-period of the switch SW2b, that is, the sampling period of the input signal V2 on the way of change to the hold capacitor C2. As a result, during this period, a voltage value close to almost the input voltage V1 is held by respective input parasitic capacitors at both input terminals of the differential amplifier 1. Accordingly, the input differential voltage of the differential amplifier 1 is held at almost zero, and the differential amplifier 1 will never be saturated. Next, at the time of holding the input signal V2 at the hold capacitance C2 due to the fact that the switch SW2b turns off, it is possible to input only a defined voltage which is almost equal to this hold voltage to the differential amplifier 1. Since the differential amplifier 1 has not been saturated at this time, there is no time lag for breaking away from saturation. Thus, the output voltage of the differential amplifier 1 can reach a defined output voltage value in a short time.

According to the above-mentioned measures, in the on-period of the switch SW2b, that is, the sampling period of the input signal V2 on the way of change to the hold capacitor C2, the hold capacitance C2 and the other input terminal of the differential amplifier 1 are separated from each other by means of the switch SWX rendered in an off state and the buffer circuit having a high input impedance, a low output impedance and high driveability. Therefore, the input signal V2 of high slew rate does not exert influence to the other input terminal of the differential amplifier 1 at the time of sampling of the input signal V2, thus making it possible to prevent reduction in speed of the voltage comparing operation.

The voltage comparator according to an aspect of the present invention comprises:

a differential amplifier having one and another inputs;

a first switch connected between a sample-and-hold capacitor for said one input of said differential amplifier and a first input node (V1);

a second switch connected between a sample-and-hold capacitor for said another input of said differential amplifier (1) and said first input node;

a third switch connected between said sample-and-hold capacitor for said another input of the differential amplifier and a second input node; and a fourth switch connected between the sample-and-hold capacitor for said another input and said another input of said differential amplifier;

wherein, by turning said first switch, and said second switch on, the voltage of said sample-and-hold capacitor for said one input of said differential amplifier and the voltage of the sample-and-hold capacitor for said another input are set to a voltage responsive to the voltage of said first input node;

wherein, then by turning said second switch off, third switch on, and said fourth switch off, the voltage of the sample-andhold capacitor for said another input is set to a voltage responding to the voltage of said second input node, and said another input of said differential amplifier is made non-responsive to the voltage of said second input node; and wherein, then by turning said third switch off and turning said fourth switch on, said another input of said differential amplifier is set to the voltage of the sample-and-hold capacitor for said another input.

Other objects and features of the present invention will become apparent with the embodiments described hereunder.

BRIEF DESCRIPTION OF THE DRAWINGS

FIGS. 8A and 8B show a further embodiment of the present invention; and

DESCRIPTION OF THE PREFERRED EMBODIMENTS

The present invention will be described in detail with reference to the drawings.

Figure 1A:
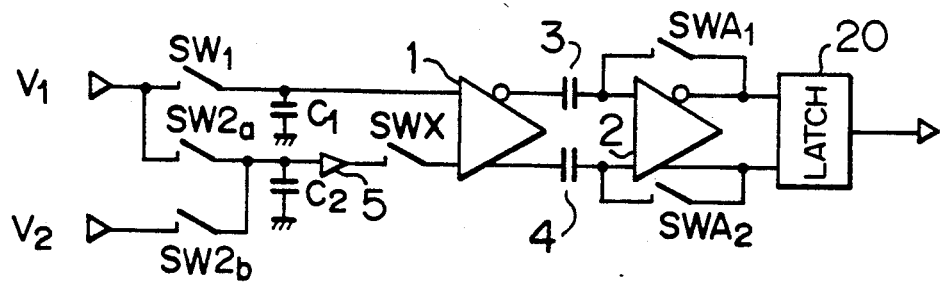
FIGS. 1A and 1B show a circuit block diagram and operation timing charts of an embodiment of a voltage comparator according to the present invention, respectively.
Figure 1B:
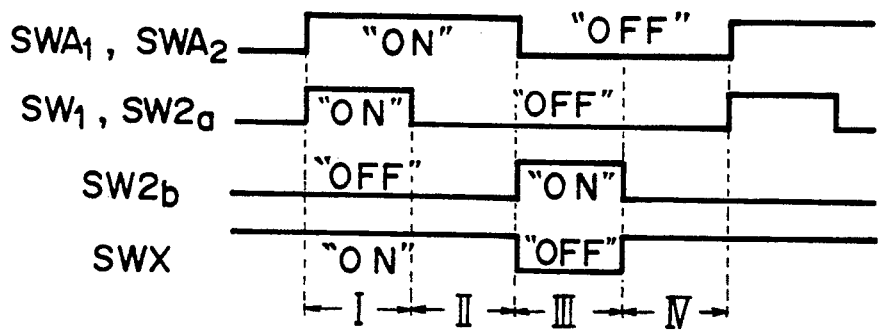
Figure 2A:
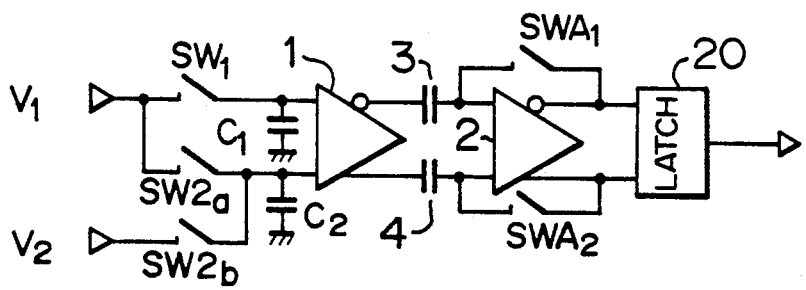
FIGS. 2A and 2B show a circuit block diagram and an operation timing chart of a voltage comparator, respectively.
Figure 2B:
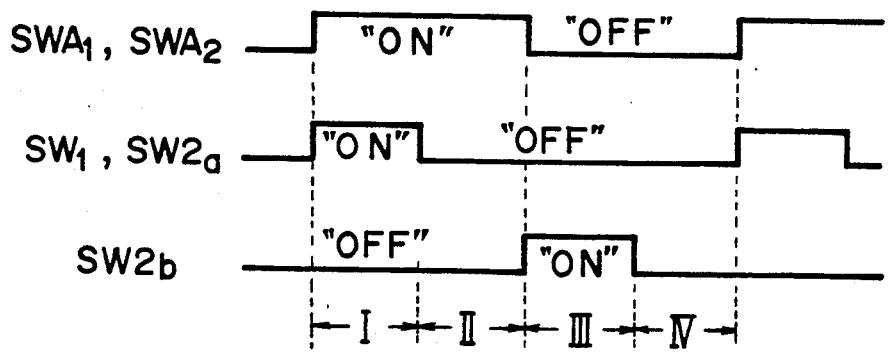

FIGS. 1A and 1B show shows an embodiment of a voltage comparator of the present invention, which is composed of a switch SW1 and a hold capacitor C1 for sampling and holding an input signal V1, switches SW2a and SW2b which input the input signals V1 and V2 while switching them to each other, a hold capacitor C2 which holds these input signals, a buffer circuit 5 which provides the voltage held at said hold capacitor 2, differential amplifiers 1 and 2 which amplify the voltage difference held at said hold capacitors C1 and C2, a switch SWX which controls the output of said buffer circuit 5 to the parasitic capacitor of the input terminal of the differential amplifier 1, AC-coupling capacitors 3 and 4 which AC-couple the output of the differential amplifier 1 with the input of the differential amplifier 2, switches SWA1 and SWA2 which make a short-circuit between the input and the output of the differential amplifier 2, and a latch circuit 20 which fetches and defines a comparison result of the differential amplifier 2.

Referring to FIG. 1B, the operation of the present voltage comparator will now be described. The switches SW1, SW2a and SWX are turned on first, and an input signal V1 is applied to both input terminals of the differential amplifier 1. At the same time, input-output short-amplifier circuiting switches SWA1 and SWA2 of the differential amplifier 2 are turned on, and the input-output terminals of the differential amplifier are self-biased.

Next, the switches SW1 and SW2a are turned off, and the input signal V1 is held at the hold capacitances C1 and C2, respectively.

Then, the switches SWA1 and SWA2 are turned off and the switch SW2b is turned on, and the input signal V2 is inputted to the hold capacitor C2 and the buffer circuit 5, but, the input signal V2 is not inputted to the differential amplifier 1 since the switch SWX is turned off at the same time.

Thereafter, the switch SW2b is turned off and the switch SWX is turned on, and the input signal V2 is held at the hold capacitor C2 at the input terminal of the buffer circuit 5. At this time, the difference between the held voltages at the hold capacitors C1 and C2 is amplified by the differential amplifiers 1 and 2, thus judging the magnitudes of the input signals V1 and V2.

Figure 3A:
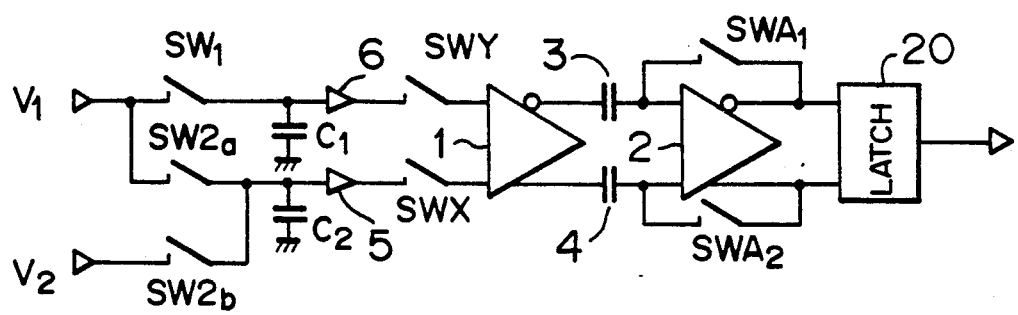
FIGS. 3A and 3B show a block diagram and a operation timing chart according to another embodiments of the present invention, respectively.
Figure 3B:
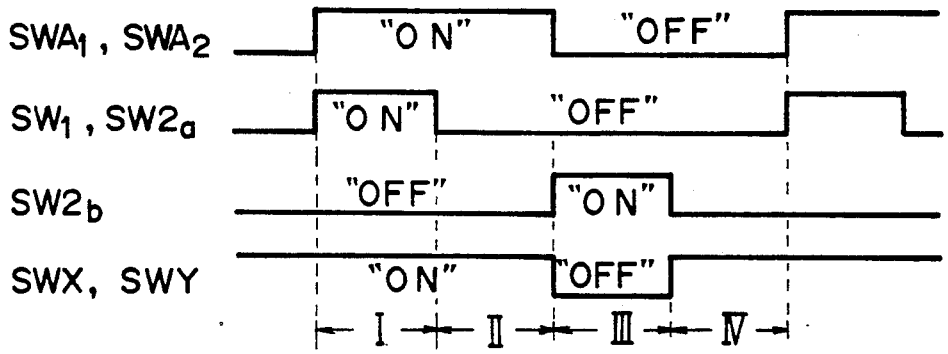

FIGS. 3A and 3B show another embodiment of the present invention. In the embodiment shown in FIG. 3A, a buffer circuit 6 and a switch SWY are also connected in series between the fetching switch SW1 of the input signal V1 and the input terminal of the differential amplifier 1 in the embodiment shown in FIGS. 1A and 1B. In the case of the present embodiment shown in FIG. 3A and 3B, it is possible to achieve improvement of accuracy as compared with the case where the buffer circuit and the switch are connected to only one of the input terminals of the differential amplifier 1 (FIG. 1A). That is, it is possible to reduce an offset voltage generated by the buffer circuit and switching charge, etc. by adding a buffer circuit and a switch to each of input terminals of the differential amplifier 1 under the same conditions.

Figure 4A:
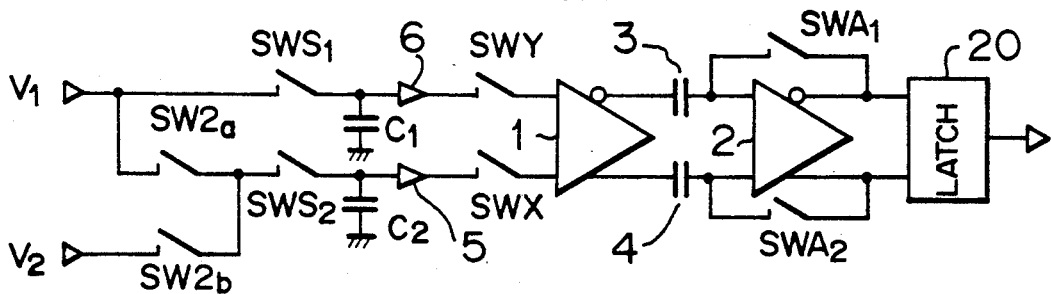
FIGS. 4A and 4B, FIGS. 5A to 5C and FIGS. 6A and 6B show other embodiments of the present invention, respectively.
Figure 4B:
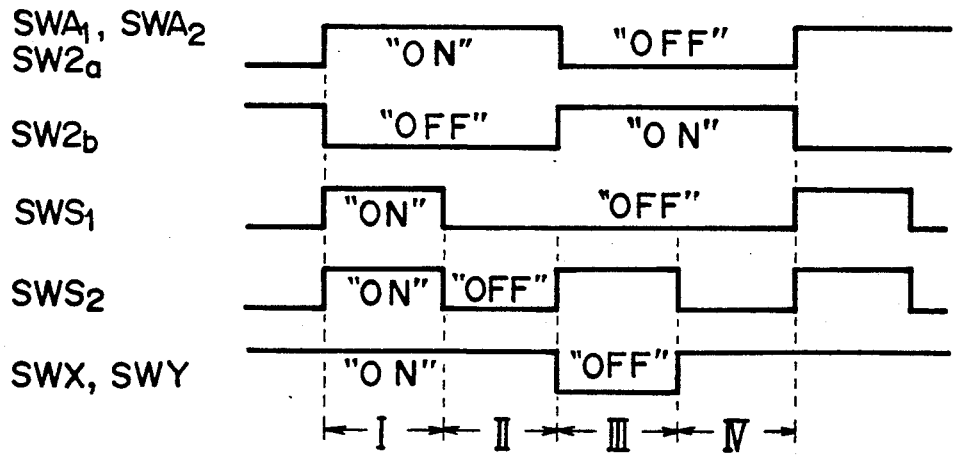

Further, FIGS. 4A and 4B show an embodiment in the case where further improvement of accuracy is contemplated. If the switching charges of the change-over input switches SW2a and SW2b of the input signals V1 and V2 are different even when the input signals V1 and V2 are equal to each other, an offset voltage of the voltage comparator is produced. Thus, in the present embodiment shown in FIGS. 4A and 4B, reduction of the offset voltage is achieved by performing sampling of the input signal V2 to hold capacitor C2 with the same switch SWS2.

Therefore, in the embodiment shown in FIGS. 4A and 4B, the switch SWS2 is additionally provided between the hold capacitor C2 at the input terminal of the buffer circuit 5 and the switches SW2a and SW2b in the embodiment shown in FIGS. 3A and 3B.

In the case where the difference in switching charge between the switches SWX and SWY is large in this embodiment shown in FIGS. 4A and 4B, the difference between both input voltages of the differential amplifier 1 increases when both switches are turned off.

Figure 5A:
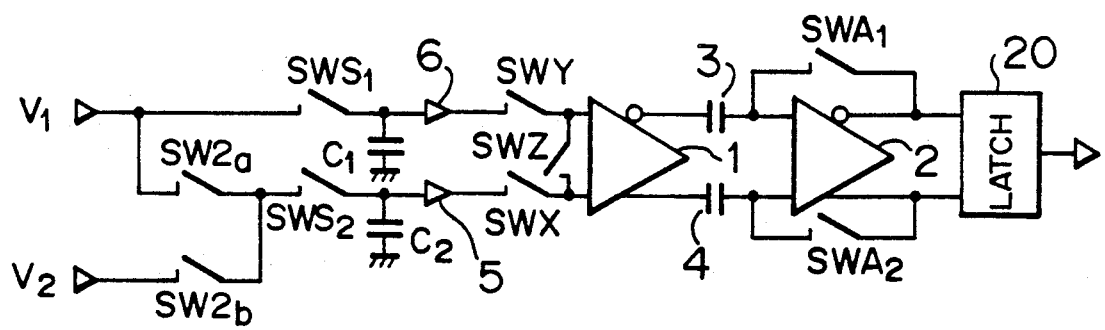
Figure 5B:
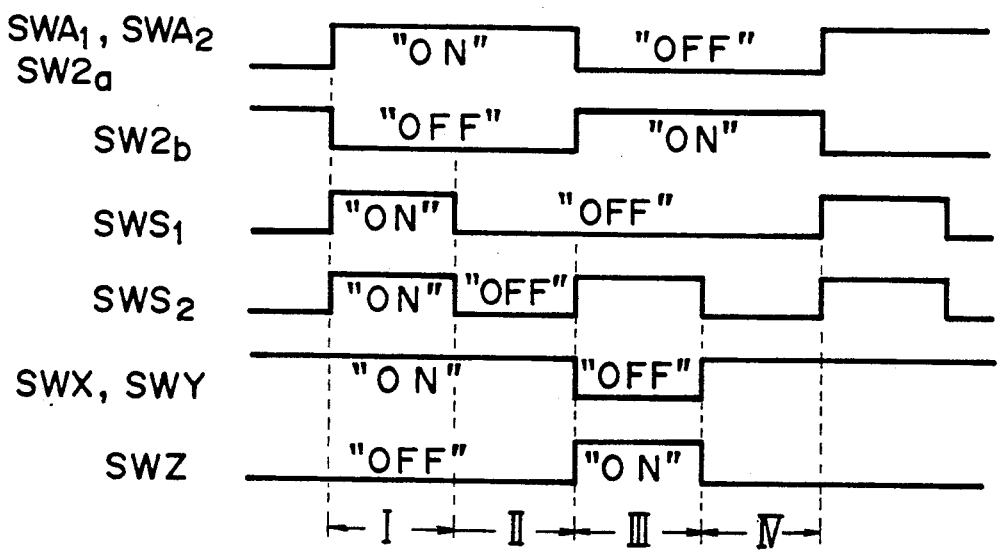
Figure 5C:
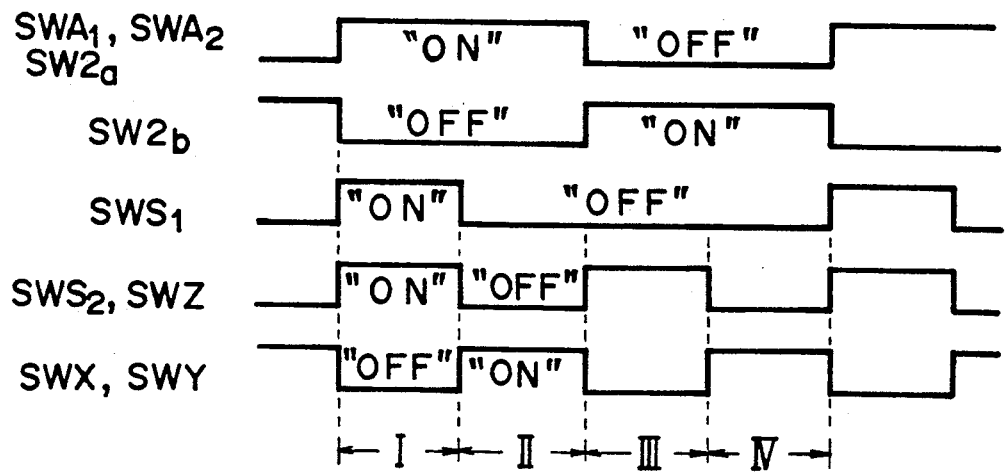

The embodiment shown in FIG. 5A to 5C shows an example in which a switch SWZ is additionally provided between the input terminals of the differential amplifier 1 in order to prevent the above-mentioned problems of the embodiment shown in FIGS. 4A and 4B.

The above-mentioned switch SWZ shown in FIG. 5A operates in a reverse manner to the switches SWX and SWY. The switches SWX and SWY are turned off and the switch SWZ is turned on only at the sampling time of the input signal V2 to the hold capacitor C2 by means of the switch SWS2, and the switches SWX and SWY are turned on and the switch SWZ is turned off during the other periods. FIG. 5B shows on and off control of these switches.

Further, FIG. 5C shows an on and off control scheme which simplifies the on and off control of the switches SWX, SWY and SWZ. In this case, it is possible to simplify the control signal by turning the switches SWX and SWY on not only at the time of sampling the input signal V2 but also at the time of sampling the input signal V1. The same is applied to the switch SWZ.

Figure 6A:
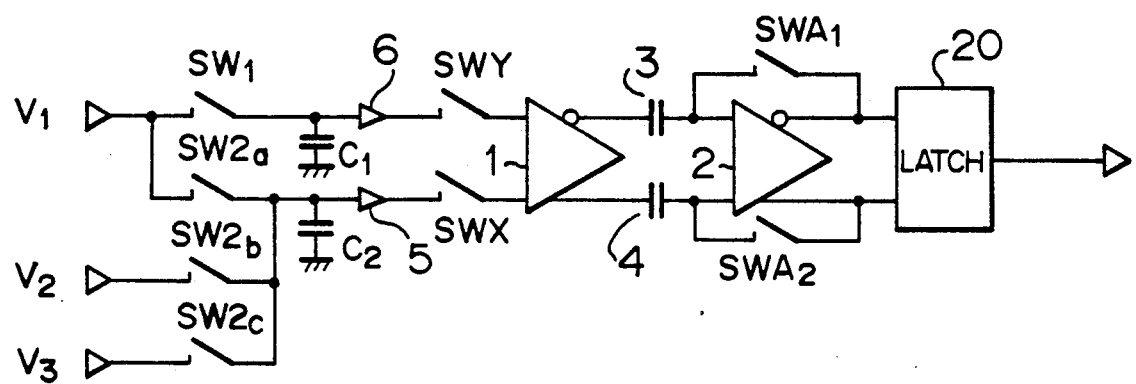
Figure 6B:
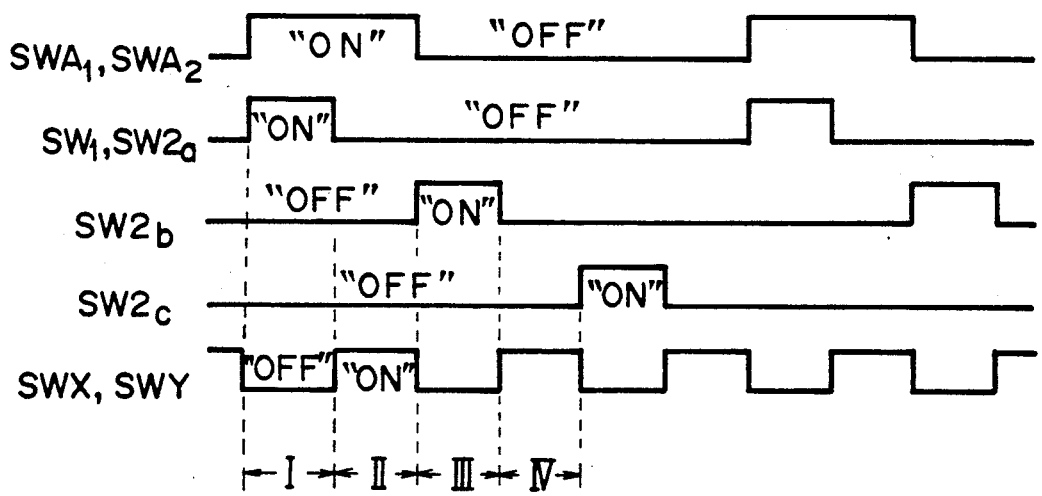

By the way, the above-mentioned embodiments of the present invention (FIGS. 1A and 1B, FIGS. 3A and 3B, FIGS. 4A and 4B and FIGS. 5A – 5C) show voltage comparators which compare the input voltage V1 with the input voltage V2 only. FIGS. 6A and 6B show an embodiment of a voltage comparator which is able to compare one input voltage V1 with some other input voltages and a scheme for on and off control of switches, respectively. The present embodiment shows a voltage comparator which is able to compare the input voltage V1 with the input voltages V2 and V3. First, the input voltage V1 and the input voltage V2 are compared with each other, and then, the input voltage V1 and the input voltage V3 are compared with each other, thus terminating voltage comparing operation.

Figures 7A, 7B:
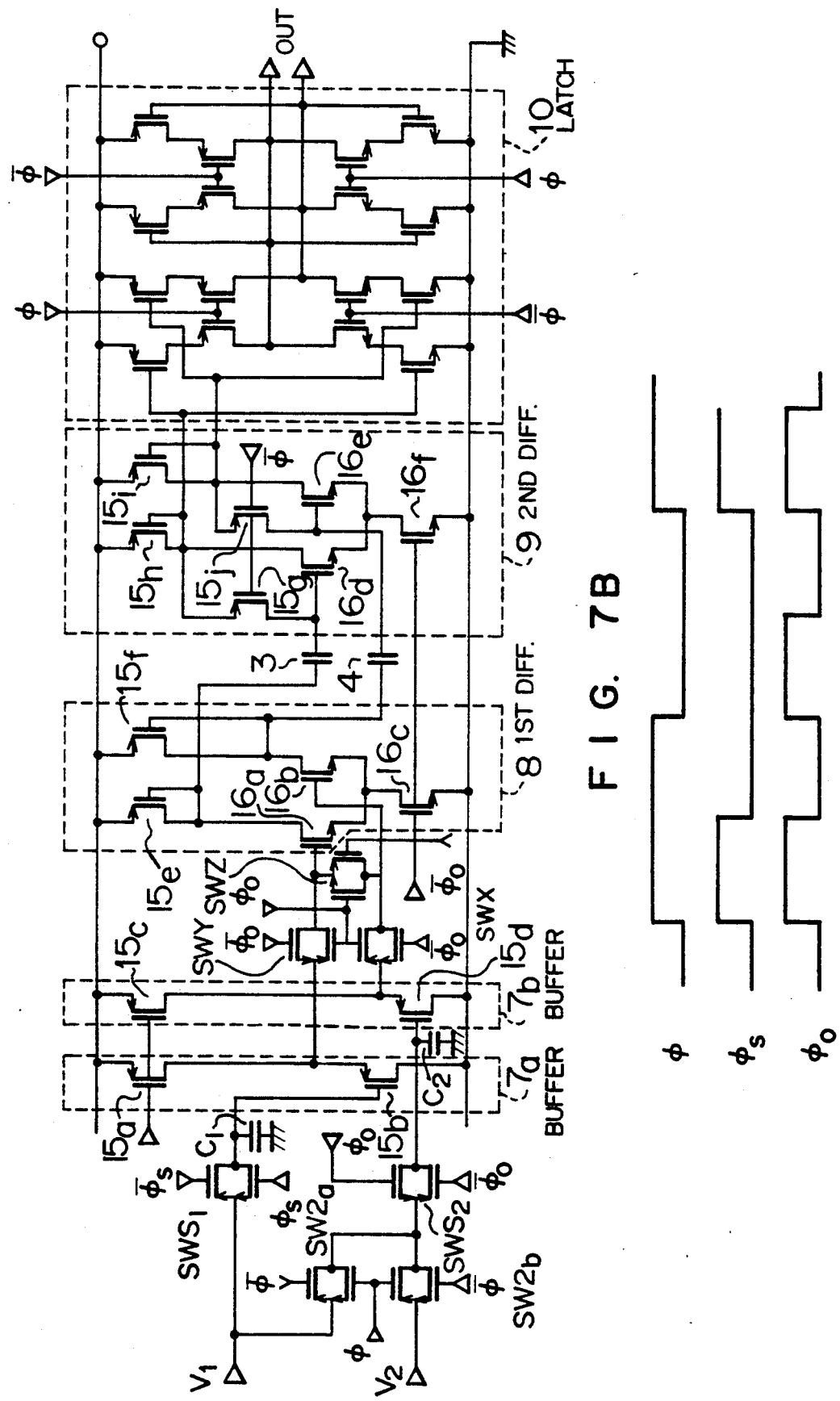
FIGS. 7A and 7B show a circuit diagram and an operation timing chart showing in detail a MOS transistor composition of a voltage comparator according to an embodiment of the present invention shown in FIGS. 5A and 5B, respectively.

FIG. 7A show an embodiment in which a voltage comparator of the present invention is implemented with a MOS transistor circuit in accordance with the circuit of FIG. 5A and switches used are operated with application of timing signals shown therein using clocks of FIG. 7B. Each of the switches is composed of a CMOS transfer gate, and each buffer circuit is composed of a source follower. In FIG. 7A, the voltage comparator includes transfer gate switches SWS1, SW2a, SW2b, SWS2, SWX, SWY, SWX, buffer amplifiers 7a and 7b, parasitic MOS capacitors C1 and C2, MOS capacitors 3 and 4, first and second differential amplifiers 8 and 9, and a latch 10. Reference numerals 15a – 15j and 16a – 16e denote PMOS and NMOS transistors, respectively. Such MOS voltage comparator including switched capacitors is easy to integrate.

FIGS. 8A and 8B also show an embodiment of a voltage comparator of the present invention. In the present embodiment, amplifier circuits 111a – 111c in which the differential amplifier 2 having switches SWA1 and SAW2 which short-circuit between the input and the output thereof and coupling capacitors 3 and 4 at the two input terminals of the differential amplifier are connected in series, respectively, are connected in series on multiple stages.

Figure 9:
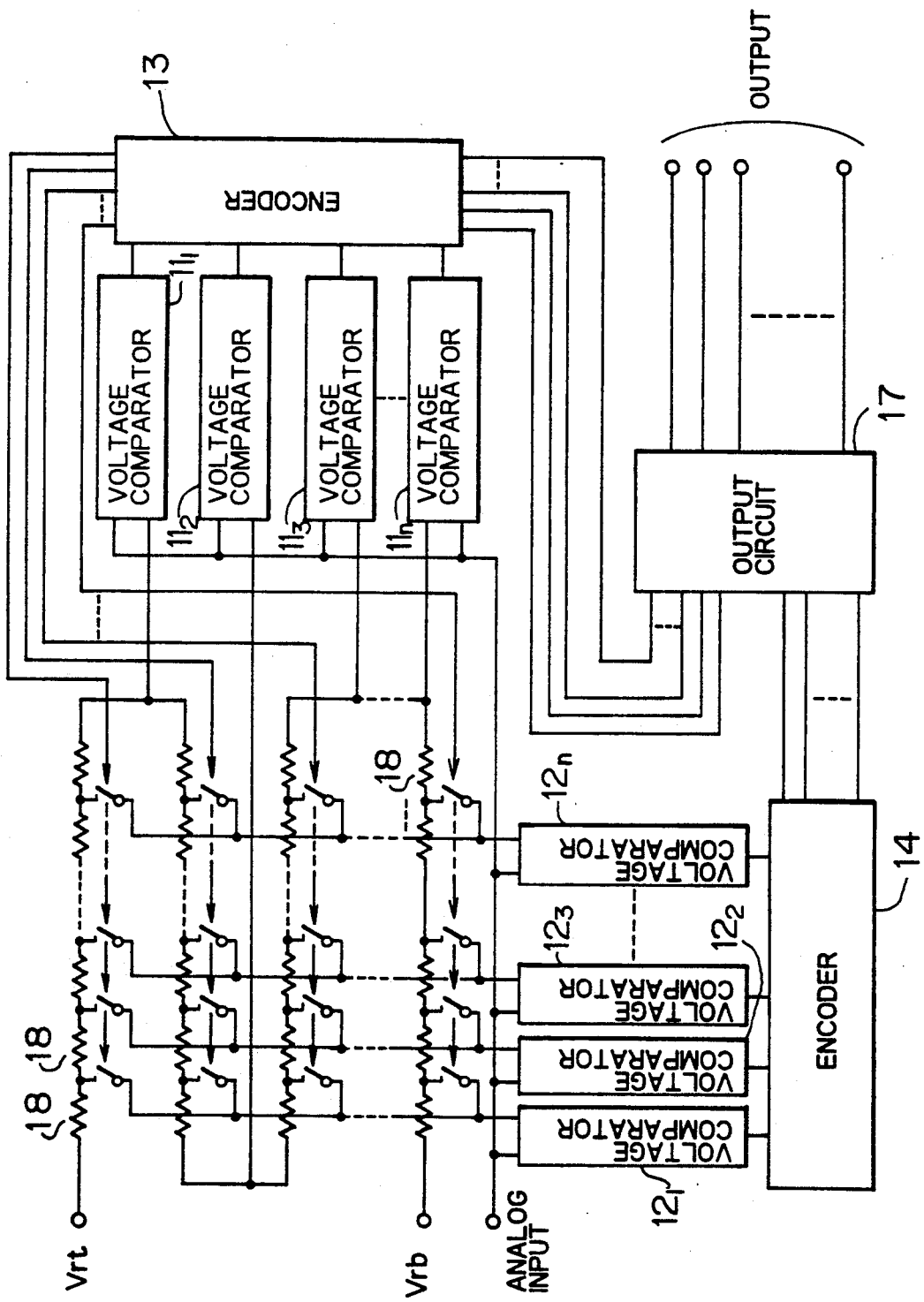
FIG. 9 shows a circuit block diagram of an embodiment of an A/D converter using a voltage comparator of the present invention.

FIG. 9 shows an embodiment of a series-parallel analog-digital (A/D) converter to which voltage comparator according to the present invention is applied. In the A/D converter, a resistor string having unit resistors 18 connected in series is connected between two reference voltages Vrt and Vrb, to thereby generate a reference voltage required for voltage comparators 11 and 12 from respective common connecting points of resistors. At the beginning, a predetermined reference voltage of the reference voltage is compared with an analog input signal by means of a voltage comparator 11 for a high order bit, and an encoder 13 for a high order bit outputs a signal which turns on a switch outputting a reference voltage applied to a voltage comparator 12 for a low order bit based on the comparison result, and further outputs a high order bit. The voltage comparator 12 for a low order bit compares the selected reference voltage with the analog input signal, and an encoder 14 for a low order bit outputs a low order bit based on the comparison result. Finally, the high order bit and the low order bit which are outputted from the encoders 13 and 14 for the high order and the low order bits are entered together in an output circuit 17, and are outputted digitally.

According to the present invention, it is possible to speed up the operation of a voltage comparator. Further, a voltage comparator which is able to respond to an input voltage of high slew rate is obtainable.

What is claimed is

1. A voltage comparator comprising:
    a differential amplifier having one and another inputs;
    a first switch connected between a sample-and-hold capacitor for said one input of said differential amplifier and a first input node;
    a second switch connected between a sample-and-hold capacitor for said another input of said differential amplifier and said first input node;
    a third switch connected between said sample-and-hold capacitor for said another input of the differential amplifier and a second input node; and
    a fourth switch connected between the sample-and-hold capacitor for said another input and said another input of said differential amplifier;
    wherein, by turning said first switch and said second switch on, the voltage of said sample-and-hold capacitor for said one input of said differential amplifier and the voltage of the sample-and-hold capacitor for said another input are set to a voltage responsive to the voltage of said first input node;
    wherein, in turn by turning said second switch off, said third switch on, and said fourth switch off thereafter, the voltage of the sample-and-hold capacitor for said another input is set to a voltage responsive to the voltage of said second input node, and said another input of said differential amplifier is made non-responsive to the voltage of said second input node; and
    wherein, then, by further turning said third switch off and said fourth switch on thereafter, said another input of said differential amplifier is set to the voltage of the sample-and-hold capacitor for said another input.

2. A voltage comparator according to claim 1, wherein a first buffer circuit connected to said fourth switch in series is provided between the sample-and-hold capacitor for said another input and said another input of said differential amplifier.

3. A voltage comparator according to claim 2, wherein a series connection of a second buffer circuit and a fifth switch is provided between the sample-and-hold capacitance for said one input and said one input of said differential amplifier.

4. A voltage comparator according to claim 3, further comprising a sixth switch connected between said one input and said another input of said differential amplifier, wherein said sixth switch is turned on when said fourth switch and said fifth switch are turned off.

5. A voltage comparator according to claim 4 further comprising:
    another differential amplifier connected to outputs of said differential amplifier;
    two coupling capacitors connected between two outputs of said differential amplifier and inputs of said another differential amplifier; and
    switches connected between said inputs and outputs of said another differential amplifier.

6. A voltage comparator according to claim 5 further comprising a latch circuit two inputs of which are connected to said outputs of said another differential amplifier.

7. A voltage comparator circuit formed in a semiconductor chip comprising:
    a MOS differential amplifier having first and second inputs;
    a first MOS switch coupled between a first sample-and-hold capacitor for the first input of said differential amplifier and a first input signal applying node;
    a second MOS switch coupled between a second sample-and-hold capacitor for the second input of said differential amplifier and said first input node;
    a third MOS switch coupled between said sample-and-hold capacitor for the second input of the differential amplifier and a second input signal applying node;
    a fourth MOS switch coupled between said second sample-and-hold capacitor and said second input of said differential amplifier; and
    switch control nodes for providing control signals for controlling the operation of said first, second, third and fourth MOS switches such that said first switch and said second switch are rendered in their on state to provide said first and second sample-and-hold capacitors with a voltage responsive to the voltage of said first input node,
    then said second switch maintains its off state and said third switch is rendered in its on state and said fourth switch is rendered in its off state to provide said second sample-and-hold capacitor with a voltage responsive to the voltage of said second input node, and retains said second input of said differential amplifier non-responsive to the voltage of said second input node, and then said third switch is rendered off and said fourth switch is rendered on to provide said second input of said differential amplifier with the voltage of the second sample-and-hold capacitor.

8. A voltage comparator according to claim 7, wherein a first buffer circuit connected to said fourth switch in series is connected between said second sample-and-hold capacitor and said second input of said differential amplifier.

9. In a voltage comparator including a differential amplifier having one and another inputs; a first switch connected between a sample-and-hold capacitor for said one input of said differential amplifier and a first input node; a second switch connected between a sample-and-hold capacitor for said another input of said differential amplifier and said first input node; a third switch connected between said sample-and-hold capacitor for said another input of the differential amplifier and a second input node; and a fourth switch connected between the sample-and-hold capacitor for said another input and said another input of said differential amplifier, a method of operating the voltage comparator comprising the steps of: in order
    rendering said first switch and said second switch in their active state so as to set the voltage of said sample-and-hold capacitor for said one input of said differential amplifier and the voltage of the sample-and-hold capacitor for said another input at a voltage responsive to the voltage of said first input node;
    rendering said second switch and said fourth switch in an off state and, said third switch in an on state, respectively so as to set the voltage of the sample-and-hold capacitor for said another input at a voltage responsive to the voltage of said second input node, while maintaining said another input of said differential amplifier non-responsive to the voltage of said second input node; and
    rendering said third switch and said fourth switch in an off state and in an on state, respectively so as to set said another input of said differential amplifier at the voltage of the sample-and-hold capacitor for said another input.

* * * * *